(12) United States Patent
Hong et al.

(10) Patent No.: US 8,610,175 B2
(45) Date of Patent: Dec. 17, 2013

(54) SEMICONDUCTOR DEVICE AND MANUFACTURING METHOD THEREOF

(75) Inventors: Zhongshan Hong, Beijing (CN); Huojin Tu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 59 days.

(21) Appl. No.: 13/316,217

(22) Filed: Dec. 9, 2011

(65) Prior Publication Data

US 2013/0037858 A1    Feb. 14, 2013

(30) Foreign Application Priority Data

Aug. 10, 2011    (CN) .......................... 2011 1 0227479

(51) Int. Cl.
*H01L 31/06*        (2012.01)

(52) U.S. Cl.
USPC ...................................................... 257/201

(58) Field of Classification Search
USPC .......... 257/190, E29.116–E29.122, E29.284, 257/E29.299, E21.432, E21.44, 257/E21.61–E21.62, 213–413, 900, 257/902–903, E21.19–E21.21, 257/E21.394–E21.458, E21.615–E21.694, 257/549–500, E29.266–E29.269, 257/E29.278–E29.279; 438/135, 142

See application file for complete search history.

(56) References Cited

U.S. PATENT DOCUMENTS

2007/0235802 A1 *    10/2007    Chong et al. .................. 257/346

* cited by examiner

*Primary Examiner* — Dao H Nguyen
*Assistant Examiner* — Tram H Nguyen
(74) *Attorney, Agent, or Firm* — Koppel, Patrick, Heybl & Philpott

(57) ABSTRACT

This invention relates to a semiconductor device and a manufacturing method thereof for reducing stacking faults caused by high content of Ge in an embedded SiGe structure. The semiconductor device comprises a Si substrate with a recess formed therein. A first SiGe layer having a Ge content gradually increased from bottom to top is formed on the recess bottom, a SiGe seed layer is formed on sidewalls of the recess and a second SiGe layer having a constant content of Ge is formed on the first SiGe layer. The thickness of the first SiGe layer is less than the depth of the recess. The Ge content in the SiGe seed layer is less than the Ge content in the second SiGe layer and the Ge content at the upper surface of the first SiGe layer is less than or equal to the Ge content in the second SiGe layer.

19 Claims, 3 Drawing Sheets

SEMICONDUCTOR DEVICE AND MANUFACTURING METHOD THEREOF

CROSS-REFERENCE TO RELATED APPLICATIONS

This application claims priority to Chinese Patent Application No. 201110227479.9, filed on Aug. 10, 2011 and entitled "Semiconductor Device and Manufacturing Method thereof," which is incorporated herein in its entirety by reference.

BACKGROUND OF THE INVENTION

1. Field of the Invention

The present invention relates to the semiconductor field, and specifically, to a semiconductor device and a manufacturing method therefor.

2. Description of the Related Art

With the continuous development of semiconductor techniques, carrier mobility enhancement techniques have been widely investigated and utilized. Carrier mobility improvement in a channel region may increase the driving current of a MOS device, thus improving device performance.

One effective mechanism for improving carrier mobility is to produce stress in a channel region. To this end, embedded SiGe techniques have been widely applied to improve the performance of PMOS devices. By embedding SiGe material in PMOS source and drain regions, embedded SiGe techniques may apply compressive stress to the channel region, causing significant PMOS performance improvement.

In embedded SiGe techniques, stress applied to the channel region can be increased by increasing the content of Ge in the embedded SiGe material. However, the large difference of Ge content between a Si substrate and the embedded SiGe material (for example, when the content of Ge in the SiGe material embedded in the source/drain regions exceeds 30 at. % (atomic percent)) may cause substantial stacking faults to occur on the interface between Si and SiGe, deteriorating the device's performance.

Therefore, a new technique is needed for eliminating or at least reducing the occurrence of stacking faults while providing high content of Ge in embedded SiGe source/drain regions.

SUMMARY OF THE INVENTION

An object of the present invention is to eliminate or reduce stacking faults due to high content of Ge in embedded SiGe source/drain regions.

According to a first aspect of the present invention, there is provided a method for manufacturing a semiconductor device, comprising: forming a recess in a Si substrate, the recess being used for forming a source region or a drain region; forming a first SiGe layer on the bottom of the recess, wherein the content of Ge in the first SiGe layer is gradually increased from bottom to top of the first SiGe layer, and the first SiGe layer has a thickness less than the depth of the recess; forming a SiGe seed layer on sidewalls of the recess which are not covered by the first SiGe layer; and forming a second SiGe layer having a uniform content of Ge on the first SiGe layer, wherein the content of Ge in the SiGe seed layer is less than the content of Ge in the second SiGe layer, and the content of Ge at the upper surface of the first SiGe layer is less than or equal to the content of Ge in the second SiGe layer.

Optionally, the content of Ge at the lower surface of the first SiGe layer is 0%, and the content of Ge at the upper surface of the first SiGe layer is equal to the content of Ge in the second SiGe layer.

Optionally, the content of Ge in the SiGe seed layer is less than or equal to 20 at. %, and the content of Ge in the second SiGe layer ranges from 20 at. % to 40 at. %.

Optionally, the SiGe seed layer has a thickness ranging from 10 Å to 200 Å, the first SiGe layer has a thickness ranging from 10 Å to 200 Å, and the second SiGe layer has a thickness ranging from 100 Å to 500 Å.

Optionally, the method further comprises forming a cap layer of SiGe or Si on the second SiGe layer, wherein the upper surface of the cap layer is flush with or higher than the upper surface of the Si substrate.

Optionally, the cap layer has a thickness ranging from 50 Å to 250 Å, and the content of Ge in the cap layer is less than or equal to 20 at. % when the cap layer is formed of SiGe.

Optionally, the step of forming the second SiGe layer further comprises doping boron (B) in the second SiGe layer through in-situ doping.

Optionally, the concentration of B in the second SiGe layer is less than or equal to $2\times10^{20}$ cm$^{-3}$.

Optionally, the first SiGe layer, the SiGe seed layer and the second SiGe layer are formed by selective epitaxial growth, wherein the reaction temperature ranges from 600° C. to 1100° C., the reaction cavity pressure ranges from 1 Torr to 500 Torr, and gases used in the growth comprise: $SiH_4$ or $SiH_2Cl_2$; $GeH_4$; HCl; and $H_2$, wherein the flow rate of $H_2$ ranges from 0.1 standard liters/min (slm) to 50 slm, and the flow rates of other gases each range from 1 sccm to 1000 sccm.

Optionally, the gases used during the formation of the second SiGe layer further comprise $B_2H_6$ or $BH_3$, wherein the flow rate of $B_2H_6$ or $BH_3$ ranges from 1 sccm to 1000 sccm.

Optionally, during the formation of the SiGe seed layer, the flow rate ratio of $GeH_4$ to $SiH_4$ or $SiH_2Cl_2$ is between 1:50 and 1:150, the flow rate ratio of $GeH_4$ to $H_2$ is between 1:5000 and 1:15000, and the reaction cavity pressure is between 20 Torr and 50 Torr.

Optionally, during the formation of the SiGe seed layer, the flow rate ratio of $GeH_4$ to HCl is between 1:25 and 1:50.

According to a second aspect of the present invention, there is provided a semiconductor device comprising: a Si substrate with a recess formed therein, the recess being used for forming a source region or a drain region; a first SiGe layer formed on the bottom of the recess, wherein the content of Ge in the first SiGe layer is gradually increased from bottom to top of the first SiGe layer and the first SiGe layer has a thickness less than the depth of the recess; a SiGe seed layer formed on sidewalls of the recess which are not covered by the first SiGe layer; and a second SiGe layer formed on the first SiGe layer and having a constant content of Ge, wherein the content of Ge in the SiGe seed layer is less than the content of Ge in the second SiGe layer and the content of Ge at the upper surface of the first SiGe layer is less than or equal to the content of Ge in the second SiGe layer.

Optionally, the content of Ge at the lower surface of the first SiGe layer is 0% and the content of Ge at the upper surface of the first SiGe layer is equal to the content of Ge in the second SiGe layer.

Optionally, the content of Ge in the SiGe seed layer is less than or equal to 20 at. %, and the content of Ge in the second SiGe layer ranges from 20 at. % to 40 at. %.

Optionally, the SiGe seed layer has a thickness ranging from 10 Å to 200 Å, the first SiGe layer has a thickness ranging from 10 Å to 200 Å, and the second SiGe layer has a thickness ranging from 100 Å to 500 Å.

Optionally, the semiconductor device further comprises a cap layer of SiGe or Si on the second SiGe layer, wherein the upper surface of the cap layer is flush with or higher than the upper surface of the Si substrate.

Optionally, the cap layer has a thickness ranging from 50 Å to 250 Å, and the content of Ge in the cap layer is less than or equal to 20 at. % when the cap layer is formed of SiGe.

Optionally, the second SiGe layer is doped with B with a concentration less than or equal to $2\times10^{20}$ cm$^{-3}$.

An advantage of the present invention is that stacking faults can be eliminated or reduced while high content of Ge can be achieved in embedded SiGe source/drain regions, thus improving the PMOS performance.

Further features of the present invention and advantages thereof will become apparent from the following detailed description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention will be more clearly understood from the following detailed description with reference of accompanying drawings, wherein.

DESCRIPTION OF THE EMBODIMENTS

Figure 1A:
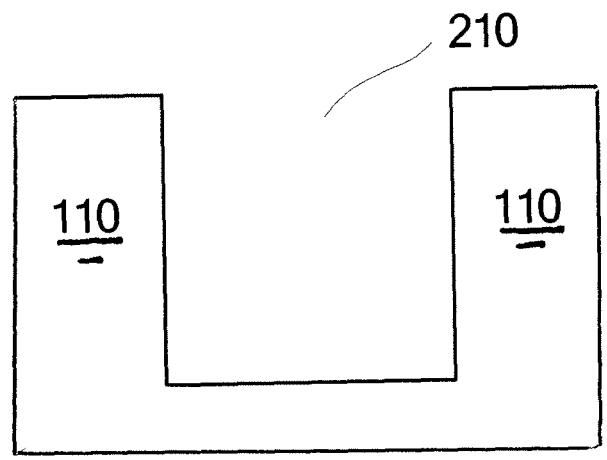
FIGS. 1A-1E are schematic sectional views of corresponding structures in the stages of a method for manufacturing a semiconductor device according to an embodiment of the invention.

Various exemplary embodiments of the present invention will now be described in detail with reference to the drawings. It is understood that the relative arrangement of the components and steps, the numerical expressions and numerical values set forth in these embodiments do not limit the scope of the present invention unless it is specifically stated otherwise.

At the same time, is also understood that for the simplicity of description, each part in these figures may not be drawn to scale.

The following description of at least one exemplary embodiment is merely illustrative in nature and is in no way intended to limit the invention, its application or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the following figures, thus once an item is defined in one figure, it is possible that it need not be further discussed for following figures.

FIGS. 1A-1E are schematic sectional views of corresponding structures in the stages of a method for manufacturing a semiconductor device according to an embodiment of the invention.

It is understood by those skilled in the art that, semiconductor devices, especially CMOS devices, usually contain not only NMOS but also PMOS devices. Since a source region or a drain region formed by embedded SiGe technique is usually used in PMOS devices, before the implementation of the steps discussed below, portions to be used for forming NMOS devices can be covered with a mask to expose merely the portions to be used for forming PMOS devices, and consequently, merely those portions for forming PMOS devices are provided with recesses which will then be filled with SiGe.

First, as shown in FIG. 1A, a recess 210 is formed in a substrate 110. The material of the substrate 110 can be, for example, Si. The recess 210 can be used to form a source region or a drain region.

The recess 210 can be formed through various well known techniques, such as dry etching. The recess 210 can be formed by etching the substrate 110 using gate and gate sidewall spacers (not shown in the figure) formed on the substrate 110 as a mask.

The recess 210 may have a "U" shape as shown in FIG. 2A, or may have any other shape as required, such as "Σ" shape, step shape and the like. The depth of the recess 210 may be determined depending on the expected depth of the source/drain region.

Figure 1B:
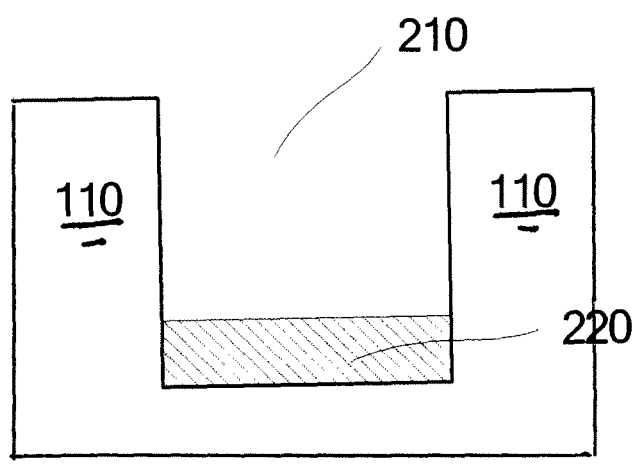

Next, as shown in FIG. 1B, a first SiGe layer 220 is formed on the bottom of the recess 210.

The first SiGe layer 220 is formed of SiGe, wherein the content of Ge is gradually increased from bottom to top, namely, gradually increasing from the bottom of the recess 210. Generally, the content of Ge at the upper surface of the first SiGe layer 220 is less than or equal to the content of Ge in a second SiGe layer 240 to be formed thereon (see FIG. 1D described below). For example, the content of Ge in the first SiGe layer 220 can be selected as follows: the content of Ge at its lower surface is 0%, and the content of Ge at its upper surface is equal to the content of Ge in the second SiGe layer 240. The content of Ge in the first SiGe layer 220 can be linearly increased from bottom to top or can vary in other ways.

The thickness of the first SiGe layer 220 is less than the depth of the recess 210. Particularly, the thickness of the first SiGe layer 220 can be determined based on specific requirements. For example, it can be 10 Å to 200 Å.

The first SiGe layer 220 can be formed through selective epitaxial growth. Gases used in the selective epitaxial growth may comprise SiH$_4$ or SiH$_2$Cl$_2$, GeH$_4$, HCl, and H$_2$. The flow rate of H$_2$ may be 0.1 slm to 50 slm and the flow rates of other gases may each be 1 sccm to 1000 sccm. The reaction temperature may be 600° C. to 1100° C. and the reaction cavity pressure may be 1 Torr to 500 Torr. In practical operations, by adjusting, the ratios of the used gases, the reaction cavity pressure and the like, SiGe can be epitaxially grown substantially upwards from the bottom of the recess 210. Further, through adjusting the flow rate of GeH$_4$, it is possible to adjust the content of Ge in the produced SiGe layer. For example, through gradually increasing the flow rate of GeH$_4$ during the process of growing the first SiGe layer 220, it is possible to cause the content of Ge in the produced first SiGe layer 220 to be gradually increased from bottom to top, until being equal to the content of Ge in the second SiGe layer 240 to be formed thereon.

Figure 1C:
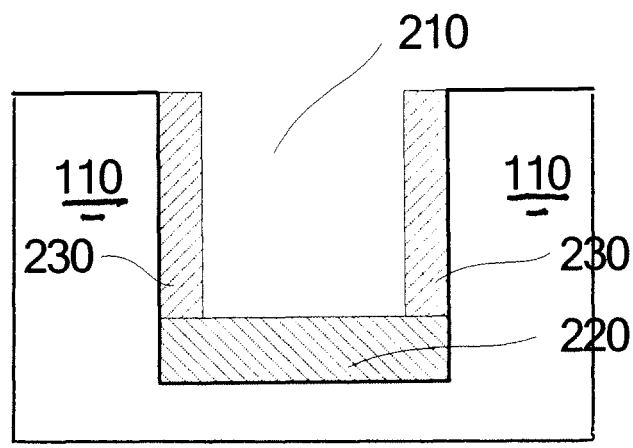

Then, as shown in FIG. 1C, a SiGe seed layer 230 is formed on sidewalls of the recess 210 which are not covered by the first SiGe layer 220.

The SiGe seed layer 230 is formed of SiGe. Generally, the content of Ge in the SiGe seed layer 230 can be uniform and less than the content of Ge in the second SiGe layer 240. For example, the content (atomic percent) of Ge in the SiGe seed layer 230 can be less than or equal to 20 at. %, such as 1 at. %, 5 at. %, 10 at. %, 20 at. % and the like.

The thickness of the SiGe seed layer 230 (i.e., the thickness of the SiGe seed layer 230 along the direction perpendicular to the sidewalls of the recess 210) can be determined as appropriate. For example, it can be 10 Å to 200 Å.

The SiGe seed layer 230 can be formed through selective epitaxial growth. Gases used in the selective epitaxial growth may comprise: $SiH_4$ or $SiH_2Cl_2$; $GeH_4$; HCl; and $H_2$. The flow rate of $H_2$ may be 0.1 slm to 50 slm and the flow rates of other gases may each be 1 sccm to 1000 sccm. The reaction temperature may be 600° C. to 1100° C. and the reaction cavity pressure may be 1 Torr to 500 Torr.

By appropriately adjusting reaction conditions during the epitaxial growth, for example, adjusting the ratios of the gases used (e.g., the flow rate ratios of $GeH_4$, $SiH_2Cl_2$ (or SiH4), H2, HCl) or the reaction cavity pressure and the like, the growing rate of SiGe on the sidewalls of the recess can be much larger than the growing rate of SiGe on the bottom of the recess. For example, when the flow rate ratio of $GeH_4$ to $SiH_2Cl_2$ ($GeH_4:SiH_2Cl_2$) is between 1:50 and 1:150, the flow rate ratio of $GeH_4$ to $H_2$ ($GeH_4:H_2$) is between 1:5000 and 1:15000, and the reaction cavity pressure is between 20 Torr and 50 Torr, the SiGe epitaxial growth substantially occurs on the sidewalls of the recess, instead of on the bottom. Adjusting the flow rate of HCl can also affect the selective SiGe growth. For example, the flow rate ratio of $GeH_4$ to HCl ($GeH_4$:HCl) can be between 1:25 and 1:50 to facilitate SiGe growth on the sidewalls. The above parameters are merely illustrative, and those of ordinary skill in the art can make various modifications and selections to those parameters depending on practical process conditions without departing from the spirit of this invention. With the optimization of the reaction parameters, the uniform SiGe seed layer 230 can be formed on the sidewalls of the recess 210. In some embodiments, depending upon reaction conditions, it is also possible to form a relatively thin SiGe seed layer on the first SiGe layer 220, which is not shown in the figure in order to not unnecessarily obscure the subject matter of the invention. It should be noted that even if a SiGe seed layer is formed on the first SiGe layer 220, it will not disadvantageously affect the implementation and technical effects of this invention, as is understood by those of ordinary skill in the art from reading the specification.

Figure 1D:
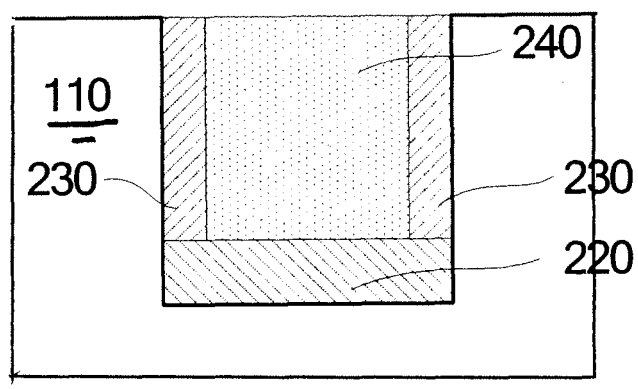

Then, as shown in FIG. 1D, the second SiGe layer 240 is formed on the first SiGe layer 220.

The second SiGe layer 240 is formed of SiGe, preferably with a constant Ge content. For example, the content (atomic percent) of Ge in the second SiGe layer can be 20 at. % to 40 at. %. As mentioned above, the content of Ge in the first SiGe layer 220, the SiGe seed layer 230 and the second SiGe layer 240 can be selected such that the content of Ge in the SiGe seed layer 230 is less than the content of Ge in the second SiGe layer 240, and the content of Ge at the upper surface of the first SiGe layer 220 is less than or equal to the content of Ge in the second SiGe layer 240.

The thickness of the second SiGe layer 240 can be determined as appropriate. For example, it can be 100 Å to 500 Å. Although the upper surface of the second SiGe layer 240 is shown in FIG. 1D as being flush with the upper surface of the substrate 110, depending upon particular process conditions or requirements, the upper surface of the second SiGe layer 240 may be higher than or lower than the upper surface of the substrate 110, which would not affect the implementation of the invention.

The second SiGe layer 240 can be formed through selective epitaxial growth. Gases used during the selective epitaxial growth may comprise: $SiH_4$ or $SiH_2Cl_2$; $GeH_4$; HCl; and $H_2$. The flow rate of $H_2$ may be 0.1 slm to 50 slm and the flow rates of other gases may each be 1 sccm to 1000 sccm. The reaction temperature may be 600° C. to 1100° C. and the reaction cavity pressure may be 1 Torr to 500 Torr. During the growth of the second SiGe layer 240, the flow rate of $GeH_4$ can be fixed, so as to obtain a consistent content of Ge.

Optionally, while epitaxially growing the second SiGe layer 240, in-situ doping with B (boron) can be carried out to get a p-type doped second SiGe layer 240 for forming a PMOS source/drain region. If in-situ doping with B is adopted, the reaction gases may further comprise $B_2H_6$ or $BH_3$, wherein the flow rate of $B_2H_6$ or $BH_3$ may be 1 sccm to 1000 sccm. In the second SiGe layer 240, the concentration of B (the amount of boron atoms contained per $cm^3$) can be less than or equal to $2 \times 10^{20}$ $cm^{-3}$. Of course, the method of producing a p-type doped second SiGe layer 240 is not so limited, and it is also possible, for example, to carry out B ion implantation after forming the second SiGe layer 240.

Thus, by the steps shown in FIGS. 1A through 1D, the recess 210 is filled with SiGe material having a structure shown in FIG. 1D, which comprises the first SiGe layer 220 formed on the bottom of the recess 210, the SiGe seed layer 230 formed on the sidewalls of the recess 210 not covered by the first SiGe layer 220 and the second SiGe layer 240 formed on the first SiGe layer 220. As compared to prior art in which SiGe material with high and constant Ge content (e.g., 30 at. %) is directly grown in the recess (similar to merely filling the recess 210 with the second SiGe layer 240), stacking faults can be significantly reduced or even eliminated. Specifically, the SiGe seed layer 230, which has a content of Ge less than that of the second SiGe layer 240, can be used as a buffer layer between the sidewalls of the recess 210 and the second SiGe layer 240, for reducing or even eliminating stacking faults caused by the large difference of Ge content between the sidewalls of the recess 210 and the second SiGe layer 240. Furthermore, the SiGe seed layer 230 can effectively prevent B diffusion from the second SiGe layer 240 to the channel. The first SiGe layer 220 has a gradually varying content of Ge, and similarly, it can be used as a buffer layer between the bottom of the recess 210 and the second SiGe layer 240, for reducing or eliminating stacking faults caused by the large difference of Ge content between the bottom of the recess 210 and the second SiGe layer 240.

Figure 1E:
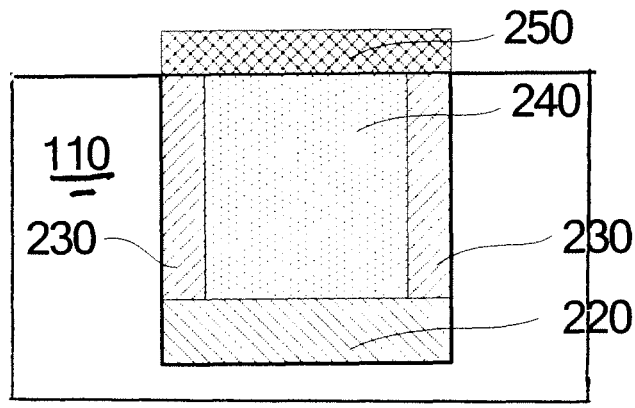

Optionally, after obtaining the structure shown in FIG. 1D, a cap layer 250 can be formed on the second SiGe layer 240. Optionally, as shown in FIG. 1E, the cap layer 250 may cover the SiGe seed layer 230 as well. The cap layer 250 may be formed of SiGe or Si. When the cap layer 250 is formed of SiGe, the content of Ge can be less than or equal to 20 at. %. The cap layer 250 can be formed through selective epitaxial growth, or can be formed in other suitable ways.

Generally, the upper surface of the cap layer 250 may be higher than the upper surface of the substrate 110 as shown in FIG. 1E or can be flush with the upper surface of the substrate 110. Therefore, even if the recess 210 was not filled up when forming the second SiGe layer 240 due to process conditions, the cap layer 250 is useful for further filling up the recess 210 so as to facilitate subsequent processes. For example, the cap layer 250 can provide sufficient Si for forming metal silicide on the surface of the source/drain region. Therefore, the thickness of the cap layer 250 can be determined depending on specific requirements. For example, it can be 50 Å to 250 Å.

Figure 2:
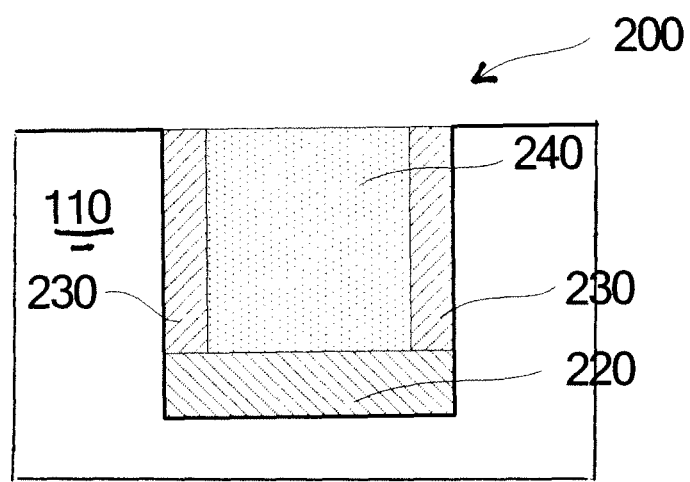
FIG. 2 shows a schematic structure of a semiconductor device according to an embodiment of the invention.

FIG. 2 shows a schematic representation of a preferred semiconductor device 200 according to an embodiment of the present invention. The semiconductor device 200 can be obtained according to the method shown in FIGS. 1A-1E.

As shown FIG. 2, the semiconductor device 200 comprises a substrate 110, which can be a Si substrate. A recess for use in forming a source/drain region, is provided in the substrate 110. The semiconductor device 200 further comprises a first SiGe layer 220 formed on the recess bottom; a SiGe seed layer 230 formed on the sidewalls of the recess which are not covered by the SiGe seed layer 230; and a second SiGe layer 240 formed on the first SiGe layer 220. The thickness of the first SiGe layer 220 is less than the depth of the recess. The content of Ge in the first SiGe layer 220 is gradually increased from bottom to top and the content of Ge in the second SiGe layer 240 is preferably uniform. The content of Ge in the SiGe seed layer 230 is less than the content of Ge in the second SiGe layer 240 and the content of Ge at the upper surface of the first SiGe layer 220 is less than or equal to the content of Ge in the second SiGe layer 240.

For example, the content of Ge at the lower surface of the first SiGe layer 220 may be 0%, and the content of Ge at the upper surface of the first SiGe layer 220 may be equal to the content of Ge in the second SiGe layer 240. By way of example, in a preferred embodiment the layers may have the following contents of Ge: the content of Ge in the SiGe seed layer 230 is less than 20 at. %, the content of Ge in the second SiGe layer 240 is 20 at. % to 40 at. %, the content of Ge in the first SiGe layer 220 gradually increases from bottom to top, with 0% at the lower surface and a content equal to the content of Ge in the second SiGe layer 240 at the upper surface.

The second SiGe layer 240 may be doped with B in a concentration selected depending on specific requirements. For example, the B concentration (the amount of boron atoms contained per $cm^3$) in the second SiGe layer 240 may be less than or equal to $2\times10^{20}$ $cm^{-3}$.

The thickness of the first SiGe layer 220 may be 10 Å to 200 Å, the thickness of the SiGe seed layer 230 may be 10 Å to 200 Å and the thickness of the second SiGe layer 240 may be 100 Å to 500 Å.

Optionally, although not shown in FIG. 2, the semiconductor device 200 may further comprise a SiGe or Si cap layer on the second SiGe layer 240. The upper surface of the cap layer may be flush with or higher than the upper surface of the substrate 110. Optionally, the cap layer may cover the SiGe seed layer 230 as well (referring to FIG. 1E in which the cap layer 250 is shown). The thickness of the cap layer can be determined depending on specific requirements. For example, it can be 50 Å to 250 Å. The content of Ge in the cap layer may be less than or equal to 20 at. % when the cap layer is formed of SiGe.

As described with reference to FIG. 1D, as compared to a conventional situation in which SiGe material with high Ge content is directly grown in the recess of the Si substrate to form an embedded SiGe structure, the stacking faults at the interface can be significantly reduced or even eliminated by introducing the first SiGe layer 220 and the SiGe seed layer 230 into the semiconductor device 200, and thus improving PMOS performance.

Thus, the method for manufacturing a semiconductor device and the semiconductor device formed by the method according to this invention have been described in detail. Some details that are well known in the art are not discussed for the purpose of not obscuring the concept of this invention. With the above description, those possessing ordinary skill in the art can thoroughly understand how to implement the techniques and solutions disclosed herein.

Although some specific embodiments of this invention have been illustrated in detail by way of examples, those possessing ordinary skill in the art will appreciate that the above examples are merely illustrative and are not intended to limit the scope of this invention. It is understood by a person possessing ordinary skill in the art that the above embodiments can be modified without departing from the scope and spirit of the present invention. The scope of the present invention is defined by the claims.

What is claimed is:

1. A method for manufacturing a semiconductor device, comprising:
   forming a recess in a Si substrate, the recess being used for forming a source region or a drain region;
   forming a first SiGe layer on the bottom of the recess, wherein the content of Ge in the first SiGe layer is gradually increased from bottom to top of the first SiGe layer, and the first SiGe layer has a thickness less than the depth of the recess;
   subsequently forming a SiGe seed layer on areas of sidewalls of the recess that are not covered by the first SiGe layer, the SiGe seed layer having a constant content of Ge; and
   forming a second SiGe layer having a uniform content of Ge on the first SiGe layer,
   wherein the content of Ge in the SiGe seed layer is less than the content of Ge in the second SiGe layer, and the content of Ge at the upper surface of the first SiGe layer is less than or equal to the content of Ge in the second SiGe layer.

2. The method according to claim 1, wherein the content of Ge at the lower surface of the first SiGe layer is 0% and the content of Ge at the upper surface of the first SiGe layer is equal to the content of Ge in the second SiGe layer.

3. The method according to claim 1, wherein the content of Ge in the SiGe seed layer is less than or equal to 20 at. %, and the content of Ge in the second SiGe layer ranges from 20 at. % to 40 at. %.

4. The method according to claim 1, wherein the SiGe seed layer has a thickness ranging from 10 Å to 200 Å, the first SiGe layer has a thickness ranging from 10 Å to 200 Å and the second SiGe layer has a thickness ranging from 100 Å to 500 Å.

5. The method according to claim 1, further comprising:
   forming a cap layer of SiGe or Si on the second SiGe layer, wherein the upper surface of the cap layer is flush with or higher than the upper surface of the Si substrate.

6. The method according to claim 5, wherein the cap layer has a thickness ranging from 50 Å to 250 Å, and
   the content of Ge in the cap layer is less than or equal to 20 at. % when the cap layer is formed of SiGe.

7. The method according to claim 1, wherein the step of forming the second SiGe layer further comprises:
   doping B in the second SiGe layer through in-situ doping.

8. The method according to claim 7, wherein the concentration of B in the second SiGe layer is less than or equal to $2\times10^{20}$ $cm^{-3}$.

9. The method according to claim 1, wherein the first SiGe layer, the SiGe seed layer and the second SiGe layer are formed by selective epitaxial growth, wherein the reaction temperature ranges from 600° C. to 1100° C., the reaction cavity pressure ranges from 1 Torr to 500 Torr, and gases used in the growth comprise:
   $SiH_4$ or $SiH_2Cl_2$;
   $GeH_4$;
   HCl; and
   $H_2$, wherein the flow rate of $H_2$ ranges from 0.1 slm to 50 slm and the flow rates of other gases each range from 1 sccm to 1000 sccm.

10. The method according to claim 9, wherein the gases used during the formation of the second SiGe layer further comprise $B_2H_6$ or $BH_3$, wherein the flow rate of $B_2H_6$ or $BH_3$ ranges from 1 sccm to 1000 sccm.

11. The method according to claim 9, wherein during the formation of the SiGe seed layer, the flow rate ratio of $GeH_4$ to $SiH_4$ or $SiH_2Cl_2$ is between 1:50 and 1:150, the flow rate ratio of $GeH_4$ to $H_2$ is between 1:5000 and 1:15000 and the reaction cavity pressure is between 20 Torr and 50 Torr.

12. The method according to claim 11, wherein during the formation of the SiGe seed layer, the flow rate ratio of $GeH_4$ to HCl is between 1:25 and 1:50.

13. A semiconductor device, comprising:
a Si substrate with a recess formed therein, the recess being used for forming a source region or a drain region;
a first SiGe layer formed on the bottom of the recess, wherein the content of Ge in the first SiGe layer gradually increases from the bottom to the top of the first SiGe layer, and the first SiGe layer has a thickness less than the depth of the recess;
a SiGe seed layer formed on areas of sidewalls of the recess that are not covered by the first SiGe layer, the SiGe seed layer having a constant content of Ge; and
a second SiGe layer formed on the first SiGe layer and having a uniform content of Ge,
wherein the content of Ge in the SiGe seed layer is less than the content of Ge in the second SiGe layer, and the content of Ge at the upper surface of the first SiGe layer is less than or equal to the content of Ge in the second SiGe layer.

14. The semiconductor device according to claim 13, wherein
the content of Ge at the lower surface of the first SiGe layer is 0% and the content of Ge at the upper surface of the first SiGe layer is equal to the content of Ge in the second SiGe layer.

15. The semiconductor device according to claim 13, wherein
the content of Ge in the SiGe seed layer is less than or equal to 20 at. % and the content of Ge in the second SiGe layer ranges from 20 at. % to 40 at. %.

16. The semiconductor device according to claim 13, wherein
the SiGe seed layer has a thickness ranging from 10 Å to 200 Å, the first SiGe layer has a thickness ranging from 10 Å to 200 Å and the second SiGe layer has a thickness ranging from 100 Å to 500 Å.

17. The semiconductor device according to claim 13, further comprising:
a cap layer of SiGe or Si on the second SiGe layer, wherein the upper surface of the cap layer is flush with or higher than the upper surface of the Si substrate.

18. The semiconductor device according to claim 17, wherein
the cap layer has a thickness ranging from 50 Å to 250 Å, and the content of Ge in the cap layer is less than or equal to 20 at. % when the cap layer is formed of SiGe.

19. The semiconductor device according to claim 13, wherein
the second SiGe layer is doped with B to a concentration less than or equal to $2 \times 10^{20}$ cm$^{-3}$.

* * * * *